(12) United States Patent
Wynn et al.

(10) Patent No.: US 12,159,988 B2
(45) Date of Patent: Dec. 3, 2024

(54) HIGH EFFICIENCY COLD PLATE

(71) Applicant: Ampaire, Inc., Hawthorne, CA (US)

(72) Inventors: Nathaniel C. Wynn, Murrieta, CA (US); Jeffrey Spitzer, San Diego, CA (US); Oliver Allan, Hawthorne, CA (US); Philip Le Roux, Hawthorne, CA (US)

(73) Assignee: Ampaire, Inc., Hawthorne, CA (US)

( * ) Notice: Subject to any disclaimer, the term of this patent is extended or adjusted under 35 U.S.C. 154(b) by 0 days.

(21) Appl. No.: 18/238,962

(22) Filed: Aug. 28, 2023

(65) Prior Publication Data

US 2024/0088475 A1   Mar. 14, 2024

Related U.S. Application Data

(62) Division of application No. 17/944,981, filed on Sep. 14, 2022, now Pat. No. 11,990,595.

(51) Int. Cl.
*H01M 10/6554* (2014.01)
*H01M 10/613* (2014.01)
(Continued)

(52) U.S. Cl.
CPC ..... *H01M 10/6554* (2015.04); *H01M 10/613* (2015.04); *H01M 10/653* (2015.04); *H01M 10/6567* (2015.04)

(58) Field of Classification Search
CPC ......... F28F 13/12; F28F 3/12; H01L 23/4735; H01M 10/613; H01M 10/625; H01M 10/653; H01M 10/6554; H01M 10/6556; H01M 10/6557; H01M 10/6567; H01M 8/0267
See application file for complete search history.

(56) References Cited

U.S. PATENT DOCUMENTS

| | | | |
|---|---|---|---|
| 8,704,485 B1 | 4/2014 | Tsukamoto et al. | |
| 9,368,845 B2 | 6/2016 | Jairazbhoy et al. | |

(Continued)

FOREIGN PATENT DOCUMENTS

| | | |
|---|---|---|
| CN | 106918165 B | 6/2020 |
| DE | 10 2012 200688 A1 | 7/2013 |

(Continued)

OTHER PUBLICATIONS

Search Report for European Application No. 23197450.2, mailed on Feb. 8, 2024, 15 pages.

*Primary Examiner* — Lingwen R Zeng

(57) ABSTRACT

Systems and methods are provided for a high efficiency cold plate system. A high efficiency cold plate system may include an interior surface. A heat source may be configured adjacent to a lower portion of the interior surface. The interior surface may enclose an interior region. The interior surface may also include members extending across the interior surface. The members may be separated by an orifice. The members and interior surface may defined an inlet region and an outlet region. The inlet and outlet regions may be fluidly joined by an orifice separating the members extending across the interior surface. The members may be angled relative to a lower portion of the interior surface. Angling the members may allow the system to constrain and direct fluid flowing through the system to achieve efficient cooling.

18 Claims, 6 Drawing Sheets

ACTIVE SURFACE 402

OUTLET PLENUM 408

ORIFICE PLATE 406

INLET PLENUM 410

ORIFICE PLATE 404

OUTLET PLENUM 412

ACTIVE SURFACE 400

(51) Int. Cl.
*H01M 10/653* (2014.01)
*H01M 10/6567* (2014.01)

(56) References Cited

U.S. PATENT DOCUMENTS

| | | |
|---|---|---|
| 9,780,421 B2 | 10/2017 | Palanchon et al. |
| 10,158,151 B2 | 12/2018 | Kenney et al. |
| 2002/0085355 A1 | 7/2002 | Oda et al. |
| 2018/0123197 A1* | 5/2018 | Liptak .................... B60L 50/64 |
| 2021/0143495 A1 | 5/2021 | Klinger et al. |
| 2021/0148639 A1 | 5/2021 | Graves |

FOREIGN PATENT DOCUMENTS

| | | |
|---|---|---|
| DE | 212019000290 U1 | 1/2021 |
| EP | 2643870 B1 | 7/2016 |
| JP | 6118531 B2 | 4/2017 |
| TW | 228156 B | 2/2005 |

* cited by examiner

HIGH EFFICIENCY COLD PLATE

CROSS REFERENCE TO RELATED APPLICATIONS

The present application is a divisional of U.S. patent application Ser. No. 17/944,981, filed Sep. 14, 2022, entitled "HIGH EFFICIENCY COLD PLATE," the disclosure thereof is incorporated by reference herein in its entirety.

TECHNICAL FIELD

The present disclosure relates generally to battery cooling systems, and in particular, some implementations may relate to a high efficiency cold plate configured for implementation in a liquid-cooled battery system.

DESCRIPTION OF RELATED ART

Battery systems are sensitive to changes in temperature and also to the effects of aging battery cells. Two factors affecting performance of a battery system are cell age and cell condition. Performance of a battery system may be predicted based on collected data, including cell temperature. Temperature may vary widely across a battery pack. This variance may make it difficult to predict performance of the battery pack and may also result in inconsistent and/or degraded performance in certain areas of the battery pack. Degradation may also spread across the whole battery pack. Two primary effects of degradation are capacity reduction and impedance. Therefore, battery packs may benefit from cooling systems and/or implementations to regulate temperature.

Systems including heat exchangers may be used to cool and/or regulate temperature of items, such as batteries. Heat exchangers may include an enclosed fluid channel and a heat exchanging surface. Different types of heat exchanging surfaces may be used depending on system needs. For example, a radiator may be used. A radiator may be a heat exchanging surface including a series of fins placed in a moving air stream. In another example, a cold plate may be used. A cold plate may be a heat exchanger including a flat surface. External items needing cooling may be thermally coupled to the flat surface. A fluid path including an inlet and an outlet may also be coupled to the flat surface. The flat surface may cool the device by transferring heat from a device, such as a battery, to fluid. Heat may then dissipate from the fluid. The flat surface may be referred to as an active service due to its role in exchanging heat.

Cold plates may be more likely to cause fluid temperature variations than radiators. Traditional cold plate implementations may include a loop style system where fluid travels back and forth relative to the active surface. In this type of system, fluid temperatures may be relatively high at hot spots compared to fluid temperatures at inlets. This may result in decreased heat transfer from the external item being cooled to the cold plate at these hot spots, and may result in a higher temperature of said external item. Specifically, many hot spots may be present in traditional cold plate systems configured to cool batteries. Therefore, to ensure an adequately low temperature at every electrochemical cell, coolant may require significant cooling, which may be heavy and expensive. Additionally or alternatively, the cooling system may be designed for higher coolant flow rates, and all else being equal higher system pressure drops. The pumps to support these flow rates and pressure drops may also be heavy, expensive, and/or power intensive.

BRIEF SUMMARY OF THE DISCLOSURE

According to various embodiments of the disclosed technology a cold plate may include an interior surface surrounding an interior region of the cold plate and a plane. The plane may comprise an opening. The plane may be in a section view. The plane may also comprise a first member extending from the interior surface. The first member may include a first element extending toward a first interior surface side of the interior surface and a second element coupled to the first element, wherein the second element extends toward a second interior surface side of the interior surface. The plane may also include a second member extending from the interior surface. The second member may include a third element extending toward the first element and a fourth element coupled to the third element, wherein the fourth element extends toward the adjacent side of the interior surface. The second element and the fourth element may be separated by an opening, thereby allowing fluid to pass between an inlet region and an outlet region.

In some embodiments, the interior surface of a cold plate may include the first interior surface side, the second interior surface side, a third interior surface side, and a fourth interior surface side. The first interior surface side and the third interior surface side may be on opposite sides. The second interior surface side and the fourth interior surface side may be on opposite sides. The second interior surface side may be adjacent to a heat source.

In some embodiments, the inlet region of a cold plate may be defined by a first part of the first interior surface side adjacent to the second interior surface side, the second interior surface side, a first part of the third interior surface side adjacent to the second interior surface side, a first part of the first member facing the second interior surface side, and a first part of the second member facing the second interior surface side. The outlet region of a cold plate may be defined by a second part of the first interior surface side adjacent to the fourth interior surface side, the fourth interior surface side, a second part of the third interior surface side adjacent to the fourth interior surface side, a second part of the first member facing the fourth interior surface side, and a second part of the second member facing the fourth interior surface side.

In some embodiments, the opening of a cold plate may be round. In some embodiments, the opening may be between 0.5 millimeters to 2.5 millimeters in diameter.

In some embodiments, a cold plate may also include a fluid inlet fluidly coupled to the inlet region and a fluid outlet fluidly coupled to the outlet region.

In some embodiments of a cold plate, the second element and the fourth element may be angled. The distance between the second element and the second interior surface side may increase as the second element reaches the opening. The distance between the fourth element and the second interior surface side may increase as the fourth element reaches the opening.

In some embodiments of a cold plate, the second element and the fourth element may be angled. The distance between the second element and the second interior surface side may decreases as the second element reaches the opening. The distance between the fourth element and the second interior surface side may increase as the fourth element reaches the opening.

In some embodiments of a cold plate, the first element may extend from the third interior surface side from a perpendicular angle and the third element may extend from the first interior surface side at a perpendicular angle. The second element may extend from the first element at a perpendicular angle and the fourth element may extend from the third element at a perpendicular angle.

In some embodiments, the first member and the second member may be separated from the second interior surface side at a first distance. In some embodiments, the first distance is less than the diameter of the opening.

In some embodiments, the heat source may be a battery or an electrochemical cell.

In some embodiments, the cold plate may be made of a carbon composite material, including carbon-carbon and/or carbon fiber based composites.

A cold plate may include a first outlet region defined by a first part of a first interior surface, a second interior surface, a first part of a third interior surface, a first part of a second member of a plane, a first opening in the plane between a first member and the second member, and a first part of the first member of the plane. A cold plate may also include an inlet region defined by a second part of the first interior surface, a second part of the first member of the plane, the first opening, a second part of the second member of the plane, a second part of a third interior surface, a first part of a fourth member of the plane, a second opening between a third member and the fourth member, and a first part of the third member of the plane. A cold plate may also include a second outlet region defined by a third part of the first interior surface, a second part of a third member of the plane, the second opening, a second part of a fourth member of the plane, a third part of a third interior surface, and a fourth interior surface. The first interior surface and the third interior surface may be on opposite sides. The second interior surface and the fourth interior surface may be on opposite sides. Each of the first interior surface side and the fourth interior surface side may be adjacent to a heat source.

In some embodiments of a cold plate, the first opening and the second opening may be round. In some embodiments of a cold plate, the first opening and the second opening may be between 0.5 millimeters and 2.5 millimeters in diameter.

In some embodiments, a cold plate may also include a fluid inlet fluidly coupled to the inlet region, a first fluid outlet fluidly coupled to the first outlet region, and a second fluid outlet fluidly coupled to the second outlet region.

In some embodiments of a cold plate, the first member may extend toward the third interior surface side. The second member may extend toward the first interior surface side. The third member may extend toward the third interior surface side. The fourth member may extend toward the first interior surface side.

In some embodiments of a cold plate, each of the first member and the second member may have a first angled element. A first distance between the first angled element and the second interior surface side may increase as the first angled element reaches the first opening. Each of the third member and the fourth member may have a second angled element. A second distance between the second angled element and the fourth interior surface side may increase as the second angled element reaches the second opening.

In some embodiments of a cold plate, each of the first member and the second member may have a third angled element. A third distance between the third angled element and the second interior surface side may decrease as the third angle element reaches the first opening. Each of the third member and the fourth member may have a fourth angled element. A fourth distance between the fourth angled element and the fourth interior surface side may decrease as the fourth angled element reaches the second opening.

In some embodiments of a cold plate, each of the first member and the second member may have a perpendicular element. A fifth distance between the first perpendicular element and the second interior surface side may stay the same as the first perpendicular element reaches the first opening. Each of the third member and the fourth member may have a second perpendicular element. A sixth distance between the second perpendicular element and the fourth interior surface side may stay the same as the second perpendicular element reaches the second opening.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of the presently disclosed technology described herein, which are defined solely by the claims attached hereto.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
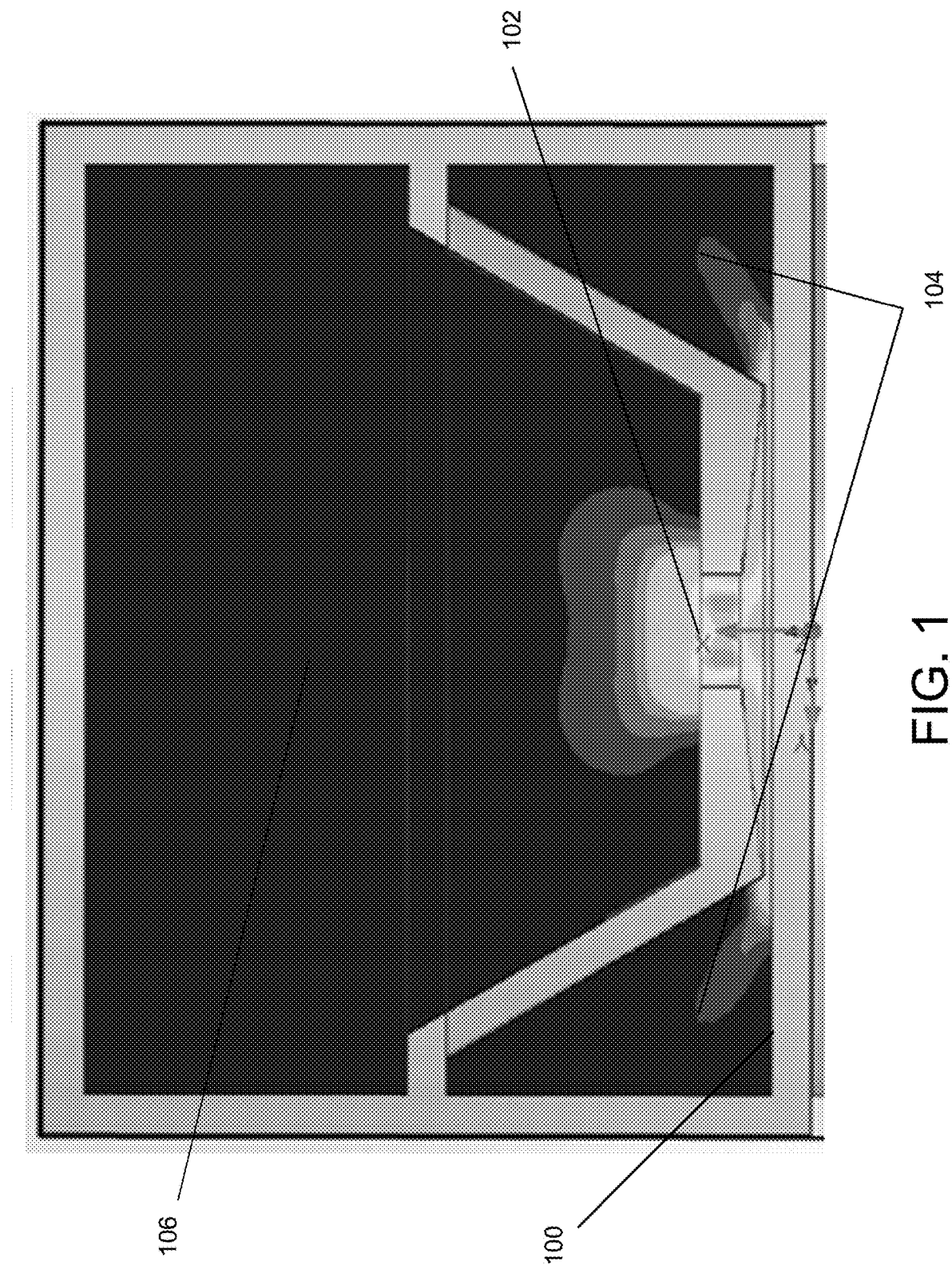
FIG. 1 is a diagram showing an example of a high efficiency cold plate system in accordance with an embodiment of the systems and methods disclosed herein.

The figures are not exhaustive and do not limit the present disclosure to the precise form disclosed.

DETAILED DESCRIPTION

Embodiments of the systems and methods disclosed herein can provide cooling and/or temperature regulation for batteries using high efficiency cold plate systems. A high efficiency cold plate system may leverage parallel fluid jets to reduce a drop in pressure across an active surface and may increase temperature consistency at any given coolant flow rate.

In a conventional cold plate system, which may comprise a relatively small number of fluid flow channels, which may each thermally couple coolant to a relatively large fraction of the cold plate surface, temperature variance may be high across the cold plate and/or across the surface of the element being cooled. In addition, the pressure drop across the cold plate may be high. The temperature variance and pressure drop may be high across the cold plate for a range of desired flow rates and resultant heat rejection rates. While turbulent flow (as opposed to laminar) may result in more consistent temperatures, and higher convective heat transfer coefficients, it may result in higher pressures for a given flow rate. For battery cooling systems, high pressure and/or high temperature variance may be undesirable for effective system cooling. As such, an optimal system configuration may be developed for a given cooling solution with a traditional cold plate, but performance may vary significantly outside a narrow range of desired coolant flow and heat rejection rates. Therefore, a cold plate system with low pressure drop and high temperature consistency may be desired to cool batteries, since batteries function best within a narrow temperature range, and future performance can be most accurately predicted if electrochemical cell temperatures are consistent within the battery.

In a high efficiency system, cold plates may be configured to provide temperature stability across an active surface. An even temperature may be maintained using efficiently configured fluid paths from a fluid inlet to a fluid outlet. Efficiently configured fluid paths may achieve a near complete independence between the fluid inlet and outlet locations and the performance in a given fluid path, resulting in stable pressure and temperature across the cold plate system. A low flow velocity, with correspondingly low pressure drop and smaller pump, may also maintain even temperature with such a system. Turbulent flow may also enable a lower differential temperature in a working fluid and may increase a convective heat transfer coefficient.

A cold plate system may also include a pump. A pressure drop across a cold plate may include 80 percent or more of the pressure drop through the entire system. A pump may be configured to overcome the total system pressure drop. The power required by the pump may be equivalent to the pressure increase times the volumetric flow rate divided by the efficiency. Different pumps may be optimized for efficiency at different points on the pressure/flow curve.

The total heat rejected through a cold plate in a steady state system may be equivalent to the specific heat capacity of the working fluid times the mass flow rate of the working fluid times the temperature difference between the cold plate outlet and inlet. This relationship may be given by the below function:

$$\dot{Q} = \dot{m} c_p \Delta T$$

where $\dot{Q}$ is the total heat rejected through the cold plate, $\dot{m}$ is the mass flow rate of the working fluid, $c_p$ is the specific heat capacity of the working fluid, and $\Delta T$ is the temperature difference between the cold plate outlet and inlet. The mass flow rate may be equal to the volumetric flow rate times the fluid density, and the volumetric flow rate may be equal to the fluid velocity times the cross section summed for all parallel channels. These relationships may assume working fluids are incompressible. This assumption may be appropriate for non-phase-change cooling systems.

For cooling certain items, such as batteries, consistency may take priority over absolute heat rejection. Therefore, the peak capable flow rate of a system with the largest capable heat rejection may not be the most efficient solution. In fact, such a solution may produce considerable inefficiencies. Specifically, by prioritizing flow rate, a system may compromise temperature and/or pressure stability which may be undesirable for a battery cooling system.

Therefore, rather than prioritizing peak flow rate, a system may be configured such that every hot spot across the system experiences about the same coolant flow rate at about the same temperature. This temperature may be about the same as the inlet temperature. Additionally, instead of employing a tube that loops back and forth, delivering fluid to and from the active surface, the system may include input and output plenums. An input plenum may refer to an interior space. This interior space may be completely filled with incoming fluid. An output plenum may refer to exterior spaces. The outlet plenums may be completely filled with outgoing fluid. In such a system, an orifice plate may be located between the input and output plenum. The orifice plate may be a plate that includes an orifice. A fluid inlet may inject fluid at each hot spot across the cold plate. Injected fluid may travel through the orifice and into the inlet plenum. At each hot spot, flow resistance may be relatively high, however resistance over the system as a whole, and the corresponding system pressure drop, may be low. The system may include converging and diverging surfaces. Converging and diverging surfaces may be geometrics surfaces that constrain and/or direct fluid flow in the cold plate system. Diverging surfaces may refer to surfaces configured such that the distance separating the surfaces increases along a direction toward which the surfaces extend. Converging surfaces may refer to surfaces configured such that the distance separating the surfaces decreases along a direction toward which the surfaces extend. Diverging surfaces may be configured to move fluid into the outlet plenum. Converging surfaces may be configured to move fluid into the inlet plenum. The converging and/or diverging surfaces may form a nozzle or jet which may increase the fluid velocity at a hot spot of the cold plate, which will increase the convective heat transfer coefficient and improve cooling at that hot spot. The system may also include a repelling mechanism, in one embodiment being a small protrusion or other geometry formed into the diverging surface such that the entire rim of the diverging surface is prevented from contacting any other surface of the high efficiency cold plate simultaneously, thus allowing fluid to flow freely to the outlets from every fluid orifice.

FIG. 1 is a diagram showing an example of a high efficiency cold plate system in accordance with an embodiment of the systems and methods disclosed herein. A high efficiency cold plate system may include active surfaces 100. It may also include a fluid inlet. It may also include an orifice plate. The orifice plate may include orifices 102. In an embodiment, the orifices may be round. Round may mean the orifices have a substantially round shape. In other embodiments, orifices may form other shapes. For example, a rectangular orifice may also be possible. The dimensions of the orifice may vary in different embodiments. For example, the dimensions of the orifice may vary depending on the element the cold plate system is configured to cool and/or the arrangement of the cold plate system. In an embodiment, the orifices may range from about 0.3 to about 3 millimeters in diameter. In an embodiment, the orifices may range from about 0.5 and 2.55 millimeters in diameter. A high efficiency cold plate may also include inlet plenums 106. The inlet plenum may be an interior space. This interior space may be completely filled with incoming fluid. The inlet plenum may form a boundary at the orifice plate. In this way, the inlet plenum may be fluidly coupled with a fluid inlet, allowing fluid to travel to the inlet plenum from the fluid inlet via orifices present in the orifice plate. The fluid inlet may allow fluid into the system.

A high efficiency cold plate system may also include outlet plenums 104. The outlet plenums may be exterior spaces. The outlet plenums may be completely filled with outgoing fluid. The outlet plenum may form a boundary with the active surfaces and may form a further boundary with the orifice plate. The system may also include a fluid outlet. The fluid outlet may be fluidly coupled with the outlet plenums. This may allow for fluid to travel from the outlet plenum to the fluid outlet, so fluid may exit the system.

In an embodiment, an orifice plate may be substantially dimpled into the inlet plenum. Substantially dimpled may mean that, in an example embodiment, the orifice plate is configured in the inlet plenum in a substantially convex configuration relative to the active surface. At the orifice of the orifice plate, the members of the orifice plate adjacent to the active surface may be angled. The orifice plate may include one member on each side of the orifice. The distance between each member and the active surface may increase as the members extend toward the orifice. A substantially dimpled configuration may provide a diverging surface between the orifice and the active surface. The orifice plate may be further dimpled into the outlet plenum. This configuration may provide a converging surface between the inlet plenum and the orifice. The dimpling into the outlet plenum may further include repelling mechanisms against the active surface. In an embodiment, the distance between the edge of the diverging surface and the active surface may be less than the diameter of the diverging surface. In an embodiment, the distance between the edge of the diverging surface and the active surface may be less than about 1/25 of the mean diameter of the diverging surface. In an embodiment, the distance between the edge of the diverging surface and the active surface may be less than about 1/50 of the mean diameter of the diverging surface.

Figure 2:
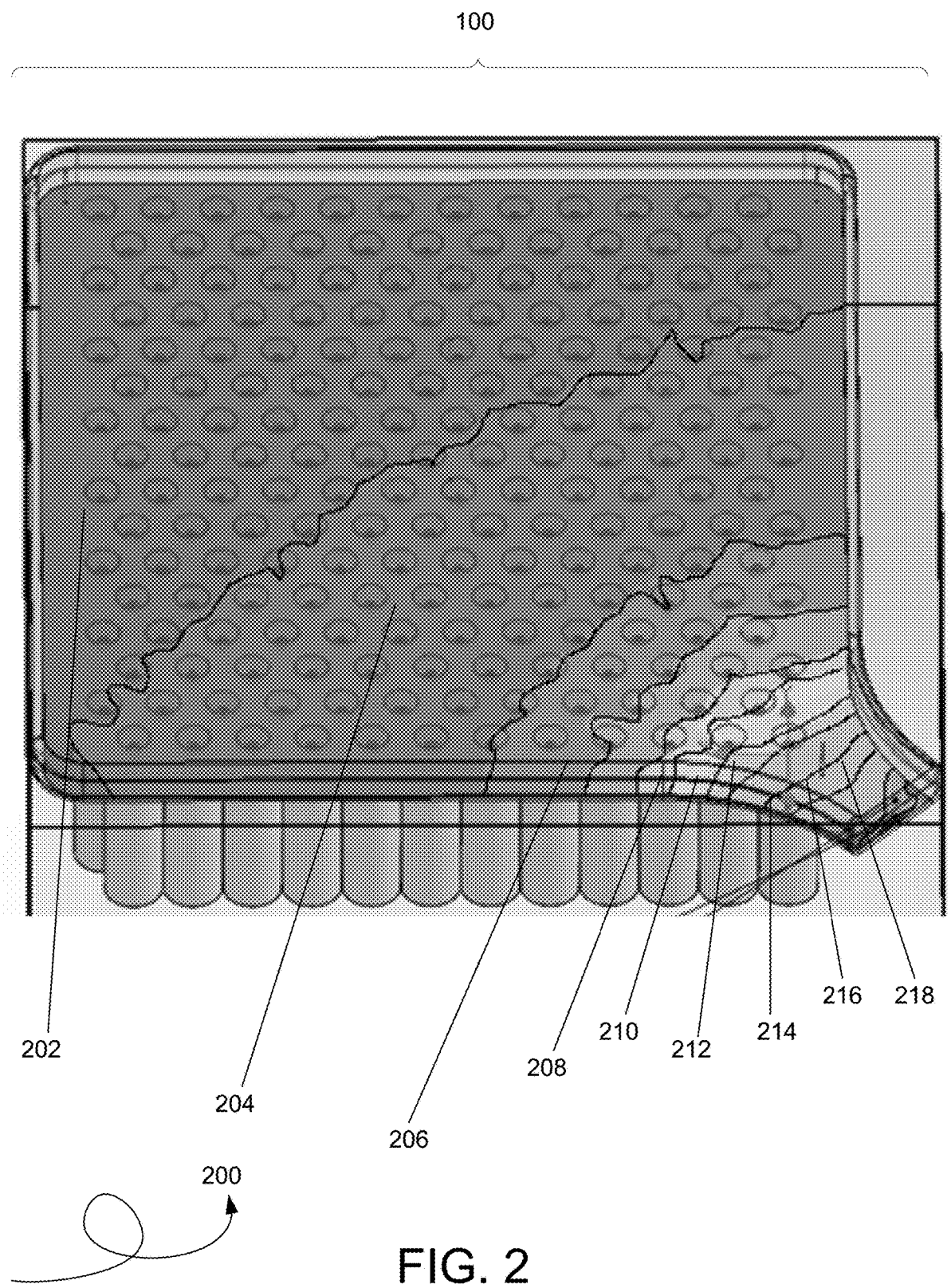
FIG. 2 is a diagram showing a pressure differential across an example high efficiency cold plate system in accordance with an embodiment of the systems and methods disclosed herein.

FIG. 2 shows an example of a pressure differential across a cold plate system 200 with a plurality of orifices. Specifically, the pressure differential extends across an active surface 100. As shown in FIG. 2, the pressure differential includes regions 202-218 of differing pressures across the cold plate system. In an example embodiment, the pressure value (measured in Pascals) for each region may be as follows: about 980 Pa at region 202, about 974 Pa at region 204, about 969 Pa at region 206, about 964 Pa at region 208, about 958 Pa at region 208, about 953 Pa at region 210, about 948 Pa at region 212, about 942 Pa at region 214, about 937 Pa at region 216, and about 932 Pa at region 216. These values are exemplary only. Other regions may also exist in such a system and may have other pressure values in different settings and/or under different conditions. As shown in the example of FIG. 2, regions 202 and 204 make up a majority of the surface area of the cold plate system. Therefore, in the example of FIG. 2 pressure remains relatively stable across the cold plate system given regions 202 and 204 occupy most of the system.

In an embodiment, the orifice plates may include corrugation. In an example embodiment, corrugation may include plates having a configuration including a plurality of folds throughout the surface of the plate. The corrugation may include a proximal section. The proximal section may be in close proximity to an active surface. In an embodiment, the plate may form a single, continuous plane. Several members and elements may comprise the plane. The plane may also include an opening and/or orifice. As an example, this figure may be illustrated in a section view. The opening and/or orifice may separate elements making up the continuous plane.

Figure 3:
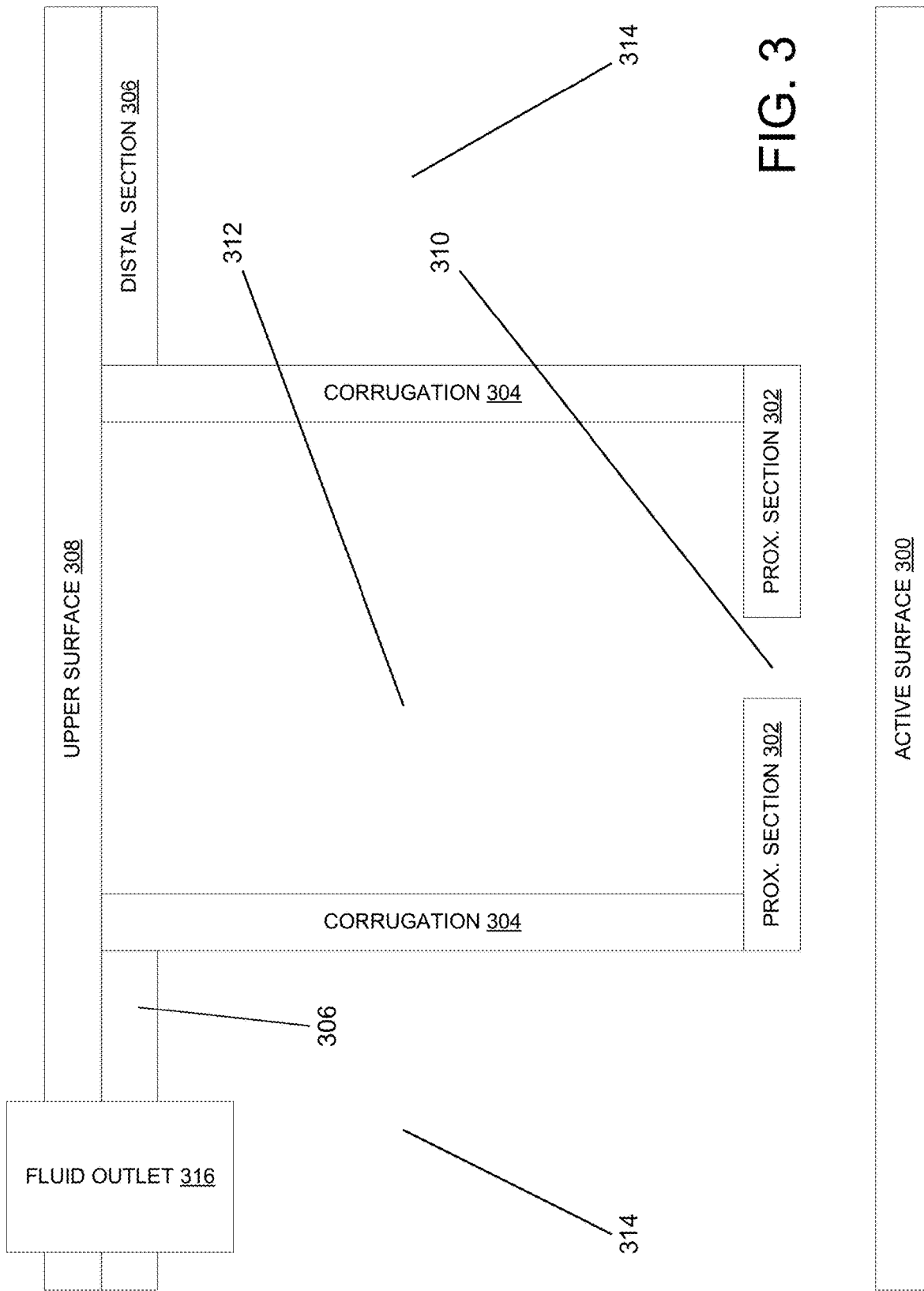
FIG. 3 is a diagram showing an example of a high efficiency cold plate system in accordance with an embodiment of the systems and methods disclosed herein.

FIG. 3 shows an example of a cold plate system in accordance with an embodiment of the systems and methods disclosed herein. In the example shown in FIG. 3, the cold plate systems include corrugation. As shown in FIG. 3, a cold plate system may include an orifice plate. An orifice plate may be a plate having at least one orifice 310 disposed within the plate. The orifice 310 may separate the plate into two sections. Each section of the plate may include a proximal section 302, a corrugation section 304, and a distal section 306. The distal section may be coupled to the corrugation section. The corrugation section may be coupled to the proximal section. The corrugation section may occupy a substantially perpendicular configuration relative to the distal and/or proximal sections (as shown in the example shown in FIG. 3). The corrugation may also occupy an angled configuration relative to the distal and/or proximal sections.

In an embodiment, the orifice plate may itself take a corrugated form. For instance, the orifice plate may include a plurality of folds throughout the surface of the plate. In other words, the orifice plate may have a form a substantially u-shaped configuration. The orifice may be located at a bottom portion of the corrugation (bottom portion of the u-shape). The distal sections and proximal sections may be substantially parallel to each other. The proximal sections may make up the bottom of the u-shape. The corrugation section may be a folded section that is configured at a non-parallel angle with respect to the distal and proximal sections. In an embodiment, the corrugation sections may be perpendicular with respect to the distal and proximal sections. In another embodiment, the corrugation sections may be oriented at some other non-parallel angle relative to the distal and proximal sections. For example, the corrugation section may be oriented at about a 135 degree angle relative to the distal and proximal sections.

In an embodiment, any and/or all of the proximal sections, distal sections, and corrugation sections of each section of the orifice plate may include corrugation. Corrugated proximal sections may be in close proximity to an active surface.

The orifice 310 may be configured between the proximal sections 302 of the orifice plate. Each section of the orifice plate, together with an upper surface 308, may enclosed and/or define an inlet plenum 312. Outlet plenums 314 may be located adjacent to each section of the orifice plate and at opposite sides of the sections of the orifice plate relative to the inlet plenum 312. The proximal sections 320 of the orifice plate may be configured in a substantially parallel direction to an active surface 300. The active surface 300 may be configured adjacent to a heat source and, in conjunction with the cold plate system, operate as a heat exchanger to cool the heat source. A cold plate system may also include a fluid outlet 316. The fluid outlet may be configured to allow fluid out of the system from the outlet plenum 314. In the system, fluid may travel between the inlet plenum 312 and outlet plenum 314 via the orifice 310.

In an embodiment, the distance between the proximal section and the active surface may be less than about 5 millimeters. In an embodiment, the distance between the proximal section and the active surface may be less than about 1 millimeter. The proximal section may include surfaces. The proximal section may include a surface distal, or opposite, to the active surface. The surface of the proximal section distal to the active surface may form a boundary of the inlet plenum. The proximal section may also include a proximal surface. The proximal surface may form a boundary of the outlet plenum. Orifices may pass through the proximal section.

In an embodiment, the corrugation may further include a distal section adjacent to an upper surface of the inlet plenum. The distal section may include surfaces. The distal section may include a proximal surface. The proximal surface of the distal section may face the active surface and may form a boundary of the outlet plenum. In an embodiment, the fluid outlet may pierce through the distal section and the upper surface.

Figure 4:
FIG. 4 a diagram showing an example of a multi-orifice high efficiency cold plate system in accordance with an embodiment of the systems and methods disclosed herein.

In an embodiment, two orifice plates may share a common inlet plenum. The orifices may be directed at active surfaces against the main faces of a substantially flat sheet. FIG. 4 shows an example embodiment of a cold plate system having two orifice plates. As shown in FIG. 4, two orifice plates 404, 406 may share a common inlet plenum 410. The orifice plates 404, 406 may be configured at opposing sides of the inlet plenum 410 in an example embodiment. An inlet plenum 410 may be configured adjacent to a first side of the first orifice plate 404. An outlet plenum 412 may be configured adjacent to a second side of the first orifice plate 404. The outlet plenum 412 and inlet plenum 410 may be configured at opposing sides of the first orifice plate 404. An active surface 400 may be configured opposite the first orifice plate 404 and adjacent to the outlet plenum 412.

An inlet plenum 410 may be configured adjacent to a first side of the second orifice plate 406. The inlet plenum 410 may be common to both the first and second orifice plates 404, 406. An outlet plenum 408 may be configured adjacent to a second side of the second orifice plate 406. An active surface 402 may be configured opposing the second orifice plate 406 and adjacent to the outlet plenum 408.

Figure 5:
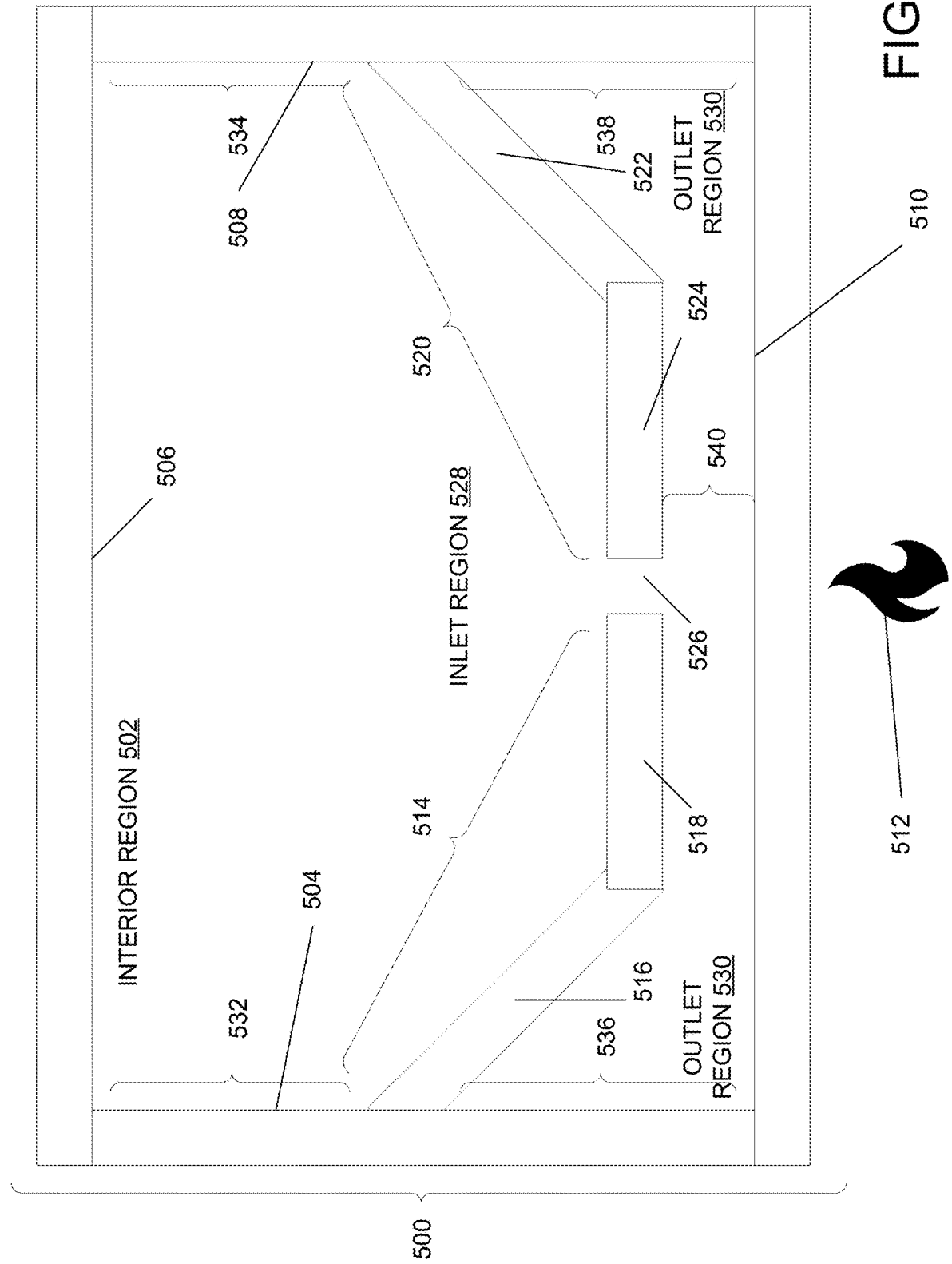
FIG. 5 is a diagram showing an example of a high efficiency cold plate system in accordance with an embodiment of the systems and methods disclosed herein.

FIG. 5 shows an example of a cold plate system in accordance with an embodiment of the system and methods disclosed herein. As shown in FIG. 5, a cold plate may include an interior surface 500. The interior surface 500 may enclose and/or surround an interior region 502. The interior surface may, in an example embodiment, include four sides. The interior surface may include a first interior surface side 504. The interior surface may also include a second interior surface side 506. The interior surface may also include a third interior surface side 508. The interior surface may also include a fourth interior surface side 510. The first interior surface side 504 may be connected to the second interior surface side 506 and the fourth interior surface side 510. The second interior surface side 506 may be connected to the first interior surface side 504 and the third interior surface side 508. The third 508 interior surface side may be connected to the second interior surface side 506 and the fourth interior surface side 510. The fourth interior surface side 510 may be connected to the third interior surface side 508 and the first interior surface side 504.

In an embodiment, the second interior surface side 506 may form a top surface side of the interior surface. In an embodiment the fourth interior surface side 510 may form a bottom interior surface side of the interior surface. The second interior surface side 506 may oppose and face the fourth interior surface side 510. The first interior surface side 504 may oppose and face the third interior surface side 508. The fourth interior surface side 510 may be configured adjacent to a heat source 512.

In an embodiment, a first member 514 may extend from the first interior surface side 504. The first member 514 may include a first element 516. The first element 516 may extend toward the fourth interior surface side 510. The first member 514 may also include a second element 518. The second element 518 may be coupled to the first element 516. The second element 518 may extend toward the third interior surface side 508. A second member 520 may extend from the third interior surface side 508. The second member 520 may include a third element 522. The third element 522 may extend toward the fourth interior surface side 510. The second member 520 may also include a fourth element 524.

The fourth element 524 may be coupled to the third element 522. The fourth element 524 may extend toward the first interior surface 504.

In an embodiment, the second element 518 and the fourth element 524 may be separated by an opening, or orifice, 526. The opening 526 may allow fluid to pass between an inlet region 528 and an outlet region 530.

In an embodiment, the inlet region 528 may be defined by parts of the interior surface 500. For example, the inlet region 528 may be defined, in part, by a first part 532 of the first interior surface side 504. The first part 532 of the first interior surface side 504 may be adjacent to the second interior surface side 506. The inlet region 528 may be further defined, in part, by the second interior surface side 506. The inlet region 528 may be further defined, in part, by a first part 534 of the third interior surface side 508. The first part 534 of the third interior surface side 508 may be adjacent to the second interior surface side 506. The inlet region 528 may be further defined, in part, by the side of the first member 514 facing the second interior surface side 506. The inlet region 528 may be further defined, in part, by the side of the second member 520 facing the second interior surface 506.

The outlet region 530 may be defined, in part, by a second part 536 of the first interior surface side 504. The second part 536 of the first interior surface side 504 may be adjacent to the fourth interior surface side 510. The outlet region may be further defined, in part, by the fourth interior surface side 510. The outlet region may be further defined, in part, by a second part 538 of the third interior surface side 508. The second part 538 of the third interior surface side 508 may be adjacent to the fourth interior surface side 510. The outlet region 530 may be further defined, in part, by the side of the first member 514 facing the fourth interior side surface 510. The outlet region 530 may be further defined, in part, by the side of the second member 520 facing the fourth interior surface side 510.

In an embodiment, the opening 526, or orifice, in a cold plate system may have a substantially round shape. In an embodiment, the opening 526 in a cold plate system may have a diameter ranging from about 0.3 millimeters to 3 millimeters. In an embodiment, the opening 526 in a cold plate system may have a diameter ranging from about 0.5 millimeters to 2.5 millimeters. In an embodiment, a fluid inlet may be fluidly coupled to the inlet region 528. The fluid inlet may allow fluid to flow into the inlet region. In an embodiment, a fluid outlet may be fluidly coupled to the outlet region 530. The fluid outlet may allow fluid to flow out of the outlet region.

In an embodiment of a cold plate system, the second element 518 and the fourth element 524 may be angled. Specifically, the second element 518 and/or fourth element 524 may be angled relative to the fourth interior side surface 510. For example, in an embodiment, the distance between the second element 518 and the fourth interior side surface 510 may increase as the second element extends toward the opening 526. Such a configuration is shows, for example, in FIG. 1. The distance between the fourth element 524 and the fourth interior side surface 510 may also increase as the fourth element 524 extends toward the opening 526. This configuration is also shown, for example, in FIG. 1. In another embodiment, the distance between the second element 518 and the fourth interior side surface 510 may decrease as the second element extends toward the opening 526. The distance between the fourth element 524 and the fourth interior side surface 510 may also decrease as the fourth element 524 extends toward the opening 526.

In an embodiment of a cold plate system, the first element 516 and the third element 522 may extend from at perpendicular angles relative to the second interior side surface 506. The second element 518 may extend from the first element 516 at a perpendicular angle relative to the first element 516. The fourth element 524 may extend from the third element 522 at a perpendicular angle relative to the third element 522. The second element 518 and the fourth element 524 may then extend at an angle parallel to the second interior side surface 506. An example configuration in which the first element 516 and the third element 522 extend at perpendicular angles relative to the second interior side surface 506 is shown in FIG. 3.

In an embodiment, the first member 514 and the second member 520 may be separated from the fourth interior side surface 510 by a first distance 540. In an embodiment, the first distance 540 may be less than the diameter of the opening 526.

In an embodiment, the heat source 512 may be a battery. The cold plate system may then be configured to efficiently cool the battery. In an embodiment, the cold plate may be fabricated using carbon fiber composite. In other embodiments, the cold plate may be substantially fabricated using aluminum alloy, carbon-carbon composite, and/or copper alloy. The above embodiments are not intended to be exhaustive. The cold plate system may be fabricated using other appropriate materials and/or combinations of materials.

Figure 6:
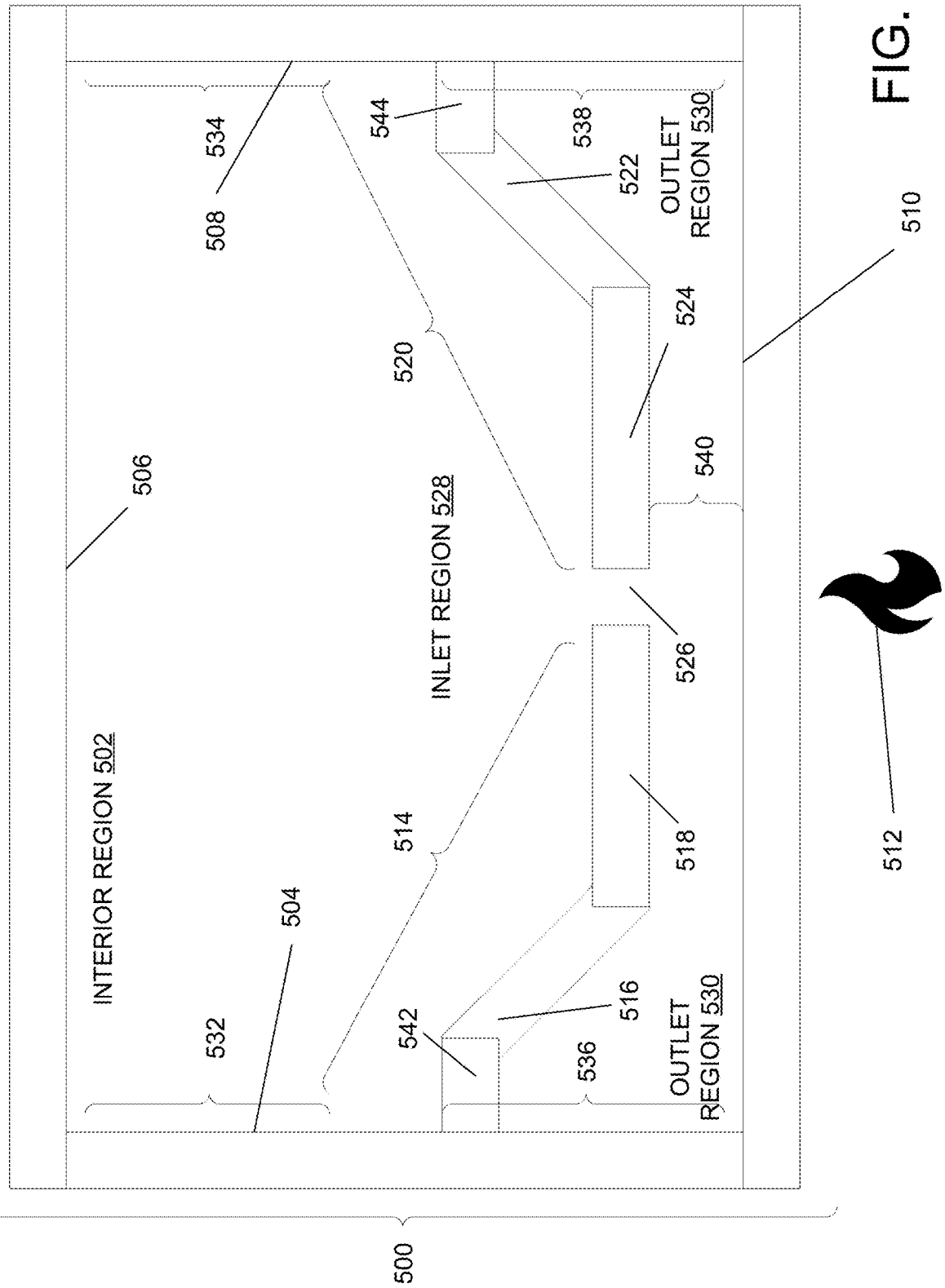
FIG. 6 is a diagram showing an example of a high efficiency cold plate system in accordance with an embodiment of the systems and methods disclosed herein.

FIG. 6 shows another example of a cold plate system in accordance with an embodiment of the system and methods disclosed herein. FIG. 6 includes many of the same components shown in FIG. 5. To the extent portions of the example diagram shown in FIG. 6 are the same as portions of the example diagram shown in FIG. 5, the above description, with respect to FIG. 5, shall apply with equal force to FIG. 6.

As shown in FIG. 6, in an embodiment of a cold plate system, a first member 514 may extend from the first interior surface side 504. The first member 514 may include a first element 516. The first element 516 may extend toward the fourth interior surface side 510. The first member 514 may also include a second element 518. The second element 518 may be coupled to the first element 516. The second element 518 may extend toward the third interior surface side 508. The first member 514 may also include a fifth element 542. The fifth element 542 may extend toward the first interior side surface 504. The fifth element 542 may be coupled to the first element 516.

A second member 520 may extend from the third interior surface side 508. The second member 520 may include a third element 522. The third element 522 may extend toward the fourth interior surface side 510. The second member 520 may also include a fourth element 524. The fourth element 524 may be coupled to the third element 522. The fourth element 524 may extend toward the first interior surface 504. The second member 520 may also include a sixth element 544. The sixth element 544 may extend toward the third interior side surface 508. The sixth element 544 may be coupled to the third element 522.

It should be understood that the various features, aspects and functionality described in one or more of the individual embodiments are not limited in their applicability to the particular embodiment with which they are described. Instead, they can be applied, alone or in various combinations, to one or more other embodiments, whether or not such embodiments are described and whether or not such features are presented as being a part of a described embodiment. Thus, the breadth and scope of the present application should not be limited by any of the above-described exemplary embodiments.

Terms and phrases used in this document, and variations thereof, unless otherwise expressly stated, should be construed as open ended as opposed to limiting. As examples of the foregoing, the term "including" should be read as meaning "including, without limitation" or the like. The term "example" is used to provide exemplary instances of the item in discussion, not an exhaustive or limiting list thereof. The terms "a" or "an" should be read as meaning "at least one," "one or more" or the like; and adjectives such as "conventional," "traditional," "normal," "standard," "known." Terms of similar meaning should not be construed as limiting the item described to a given time period or to an item available as of a given time. Instead, they should be read to encompass conventional, traditional, normal, or standard technologies that may be available or known now or at any time in the future. Where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the aspects or functionality described or claimed as part of the component are all configured in a common package. Indeed, any or all of the various aspects of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The terms "substantially," "approximately," and "about" are used throughout this disclosure, including the claims, are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

What is claimed is:

1. A cold plate comprising:
   a chamber defining an interior region of the cold plate, the chamber comprising a first side, a second side adjacent to the first side, a third side adjacent to the second side, and a fourth side adjacent to the third side and the first side, the second side having a first active surface to be cooled, the fourth side having a second active surface to be cooled;
   a first orifice plate coupled to the first side and separating an inlet plenum of the interior space from a first outlet plenum of the interior space, the first outlet plenum being in contact with the first active surface, the first orifice plate comprising a first opening that fluidly couples the inlet plenum and the first outlet plenum and directs fluid onto the first active surface;

a second orifice plate coupled to the first side and separating the inlet plenum of the interior space from a second outlet plenum of the interior space, the second outlet plenum being in contact with the second active surface, the second orifice plate comprising a second opening that fluidly couples the inlet plenum and the second outlet plenum and directs fluid onto the second active surface.

2. The cold plate of claim 1, wherein the first side and the third side are on opposite sides, wherein the second side and the fourth side are on opposite sides, wherein the second side is adjacent to a first heat source outside the chamber, and wherein the fourth side is adjacent to a second heat source outside the chamber.

3. The cold plate of claim 2, wherein at least one of the first and second heat sources is an electrochemical cell.

4. The cold plate of claim 1, wherein at least one of the first and second openings is round.

5. The cold plate of claim 4, wherein at least one of the first and second openings is between 0.5 millimeters and 2.5 millimeters in diameter.

6. The cold plate of claim 1, further comprising:
a fluid inlet fluidly coupled to the inlet plenum;
a first fluid outlet fluidly coupled to the first outlet plenum; and
a second fluid outlet fluidly coupled to the second outlet plenum.

7. The cold plate of claim 1, wherein the first orifice plate further comprises:
a first section extending from the first side of the interior surface toward the first active surface; and
a second section extending from the first section to the first opening.

8. The cold plate of claim 7, wherein the second section is angled with respect to the first active surface, wherein the distance between the second section and the second side increases as the second section reaches the first opening.

9. The cold plate of claim 7, wherein the second section is angled with respect to the first active surface, wherein the distance between the second section and the second side decreases as the second section reaches the first opening.

10. The cold plate of claim 7, wherein the second section is separated from the second side at a first distance.

11. The cold plate of claim 10, wherein the first distance is less than the diameter of the first opening.

12. The cold plate of claim 1, wherein the cold plate is made of one of:
carbon fiber composite;
aluminum; and
steel.

13. The cold plate of claim 1, wherein pressurization of the inlet plenum relative to the first outlet plenum increases the convective coefficient on the first active surface immediately adjacent to the first opening relative to other areas of the first active surface.

14. The cold plate of claim 1, wherein fluid flow from the inlet plenum to the first outlet plenum increases the convective coefficient on the first active surface immediately adjacent to the first opening relative to other areas of the first active surface.

15. The cold plate of claim 1, wherein the first active surface comprises at least one hot spot near the first opening.

16. The cold plate of claim 15, wherein fluid flow from the inlet plenum to the first outlet plenum causes flow of the fluid to be turbulent at the hot spot.

17. The cold plate of claim 15, wherein fluid flow from the inlet plenum to the first outlet plenum causes flow of the fluid to be laminar at the hot spot.

18. The cold plate of claim 7, wherein the second section comprises:
at least one protrusion to ensure a separation between the first opening and the first active surface.

* * * * *